US007089171B2

(12) United States Patent
Gravrok

(10) Patent No.: US 7,089,171 B2
(45) Date of Patent: Aug. 8, 2006

(54) METHOD FOR CHARACTERIZING THE ACCURACY OF A SIMULATED ELECTRICAL CIRCUIT MODEL

(75) Inventor: Roger John Gravrok, Eau Claire, WI (US)

(73) Assignee: International Business Machines Corporation, Armonk, NY (US)

( * ) Notice: Subject to any disclaimer, the term of this patent is extended or adjusted under 35 U.S.C. 154(b) by 700 days.

(21) Appl. No.: 10/279,948

(22) Filed: Oct. 24, 2002

(65) Prior Publication Data

US 2004/0083086 A1    Apr. 29, 2004

(51) Int. Cl.
*G06F 17/50*    (2006.01)

(52) U.S. Cl. ............................................ 703/14; 716/4
(58) Field of Classification Search ................. 703/14, 703/19; 716/4; 340/515; 714/741; 700/30
See application file for complete search history.

(56) References Cited

U.S. PATENT DOCUMENTS

| 5,559,997 A | * | 9/1996 | Tsuchida et al. ................ 716/1 |
| 6,459,066 B1 | * | 10/2002 | Khater et al. .......... 219/121.41 |
| 6,519,556 B1 | * | 2/2003 | Chikamichi ................... 703/13 |
| 6,789,239 B1 | * | 9/2004 | Yamada .......................... 716/4 |
| 6,829,330 B1 | * | 12/2004 | Belge et al. ............. 379/22.04 |
| 6,892,171 B1 | * | 5/2005 | Baco ........................... 703/13 |

* cited by examiner

*Primary Examiner*—Albert W. Paladini
(74) *Attorney, Agent, or Firm*—Robert R. Williams

(57) ABSTRACT

Methods are disclosed for quantitatively characterizing the accuracy of a simulated electrical circuit model. In particular, available circuit simulation programs make use of "black box" models of transmission lines used to carry high-speed electrical signals. Electrical transmission lines are characterized by resistance, inductance, capacitance, and dielectric conductance, all values of which may vary with frequency. The "black box" model must accurately model the transmission line over a wide range of frequencies in a time-domain simulation. Algorithms used in the "black box" model may not accurately model the transmission line over the frequency range. Such inaccuracies must be quantified, and if excessive, must be corrected.

16 Claims, 7 Drawing Sheets

| Simulated RLCG Frequency | R | L | C | G |
|---|---|---|---|---|
| 4.640E-003 | 3.032E-004 | 4.351E-003 | 1.534E+000 | 3.356E-004 |
| 1.000E-002 | 3.388E-004 | 4.605E-003 | 1.687E+000 | 4.324E-003 |
| 2.150E-002 | 3.806E-004 | 4.203E-003 | 1.722E+000 | 7.591E-003 |
| 4.640E-002 | 4.150E-004 | 3.957E-003 | 1.631E+000 | 2.446E-002 |
| 1.000E-001 | 4.733E-004 | 3.859E-003 | 1.589E+000 | 3.411E-002 |
| 2.150E-001 | 6.514E-004 | 3.763E-003 | 1.574E+000 | 5.456E-002 |
| 4.640E-001 | 9.781E-004 | 3.609E-003 | 1.553E+000 | 1.092E-001 |
| 1.000E+000 | 1.165E-003 | 3.510E-003 | 1.538E+000 | 1.382E-001 |
| 2.150E+000 | 1.569E-003 | 3.485E-003 | 1.537E+000 | 3.034E-001 |
| 4.638E+000 | 2.528E-003 | 3.448E-003 | 1.526E+000 | 7.458E-001 |
| 1.000E+001 | 3.145E-003 | 3.386E-003 | 1.514E+000 | 1.033E+000 |

FIG. 2A

| Input RLCG Frequency | R | L | C | G |
|---|---|---|---|---|
| 1.000E-006 | 2.865E-004 | 6.195E-003 | 1.518E+000 | 1.431E-007 |
| 2.150E-006 | 2.865E-004 | 6.195E-003 | 1.518E+000 | 3.077E-007 |
| 4.640E-006 | 2.865E-004 | 6.194E-003 | 1.518E+000 | 6.640E-007 |
| 1.000E-005 | 2.865E-004 | 6.194E-003 | 1.518E+000 | 1.431E-006 |
| 2.150E-005 | 2.865E-004 | 6.194E-003 | 1.518E+000 | 3.077E-006 |
| 4.640E-005 | 2.865E-004 | 6.191E-003 | 1.518E+000 | 6.640E-006 |
| 1.000E-004 | 2.866E-004 | 6.176E-003 | 1.518E+000 | 1.431E-005 |
| 2.150E-004 | 2.870E-004 | 6.113E-003 | 1.518E+000 | 3.077E-005 |
| 4.640E-004 | 2.886E-004 | 5.874E-003 | 1.518E+000 | 6.640E-005 |
| 1.000E-003 | 2.929E-004 | 5.289E-003 | 1.518E+000 | 1.431E-004 |
| 2.150E-003 | 2.992E-004 | 4.616E-003 | 1.518E+000 | 3.077E-004 |
| 4.640E-003 | 3.062E-004 | 4.160E-003 | 1.518E+000 | 6.640E-004 |
| 1.000E-002 | 3.129E-004 | 3.929E-003 | 1.518E+000 | 1.431E-003 |
| 2.150E-002 | 3.213E-004 | 3.833E-003 | 1.518E+000 | 3.077E-003 |
| 4.640E-002 | 3.431E-004 | 3.772E-003 | 1.518E+000 | 6.640E-003 |
| 1.000E-001 | 3.943E-004 | 3.699E-003 | 1.518E+000 | 1.431E-002 |
| 2.150E-001 | 4.904E-004 | 3.623E-003 | 1.518E+000 | 3.077E-002 |
| 4.640E-001 | 6.644E-004 | 3.555E-003 | 1.518E+000 | 6.640E-002 |
| 1.000E+000 | 9.700E-004 | 3.495E-003 | 1.518E+000 | 1.431E-001 |
| 2.150E+000 | 1.410E-003 | 3.448E-003 | 1.518E+000 | 3.077E-001 |
| 4.640E+000 | 2.052E-003 | 3.415E-003 | 1.518E+000 | 6.640E-001 |
| 1.000E+001 | 3.002E-003 | 3.393E-003 | 1.518E+000 | 1.431E+000 |

FIG. 2B

METHOD FOR CHARACTERIZING THE ACCURACY OF A SIMULATED ELECTRICAL CIRCUIT MODEL

FIELD OF THE INVENTION

The present invention relates to circuit simulation models. In particular, the present invention relates to transmission line models used in the process of simulating high-speed signal transmission.

DESCRIPTION OF RELATED ART

Historically, electronic systems, and in particular, computer systems, comprise a number of semiconductor chips, upon which circuitry is placed. That circuitry performs the desired logic and other functions required by the electronic system. For example, the chips in a computer system have logical circuitry which performs AND, OR, and latch functions, for example. These and other circuitry are coupled together to create, for example, Arithmetic Logic Units (ALUs), Floating Point Units (FPUs), memories in various levels of memory hierarchies, and controllers. Modern electronic systems utilize a vast range of electronic circuit functions, and the above examples represent but a small sample of such circuitry.

The chips are typically mounted on modules, which are typically further mounted on Printed Wiring Boards (PWBs). The PWBs are coupled together with cables, or by plugging the PWBs into yet another level of PWB.

The chips are coupled together by signal conductors that carry signals from one chip to another. Signal conductors may couple chips mounted on the same module, in the case of a Multi-Chip Module (MCM) packaging arrangement. In addition, signal conductors may also couple chips on different modules, and different PWBs depending on interconnection requirements of the system.

Signal conductors used in modern electronic systems are designed as transmission lines. Transmission lines have a conductor for carrying the signal, and a nearby conducting path for carrying return current. Transmission lines intended to carry high frequency signals are electrically modeled with an "RLCG" (series Resistance per unit length (R); series inductance per unit length (L); parallel capacitance per unit length (C); and parallel conductance per unit length (G). Suitable units for these modeling elements are chosen. For example, resistance in ohms/cm; inductance in henries/cm; capacitance in farads/cm; and conductance in siemens/cm would be a compatible set of units, when voltage is measured in volts, and electrical current is measured in amps. Many textbooks describe transmission lines and their mathematical equations. For example, "High Speed Digital Design", by Howard Johnson and Martin Graham, © 1993 by Prentice Hall PTR, ISBN 0-13-3395724-1 describes transmission lines in some detail (hereinafter "Johnson")

Each of the RLCG elements may be frequency dependent, and accurate characterization and modeling of each element is a requirement when simulating the very high-speed signals used in modern electronic systems. Such signals comprise frequency components of many gigahertz. For example, the resistance of the signal conductor is a strong function of frequency. Typical transmission line modeling should include resistance frequency effects for frequency components over 100 megahertz (MHz), and certainly, for frequency components over 1 gigahertz (GHz). L, C, and G are also dependent upon frequency.

Signals transmitted on a transmission line typically stay at a low level for a period of time, have very fast rise times, stay at a high level for a second period of time, and then have a very fast fall time to the low level. These signals have an extremely wide range of frequency components. Failure to accurately model all significant frequency components of the signal in a computer model will result in an inaccurate simulation of the signal as it moves on the transmission line. Optimizing the design of high-performance electronic systems relies on the accuracy of electrical circuit models and circuit simulators. The quantitative results from circuit simulators are relied upon to determine performance and reliability limits during all critical phases of the system design. Based on these simulations, high-level business commitments are made long before hardware is available. Reliance on a model that fails to accurately model the RLCG characteristics of a transmission line, including frequency effects, can, and has, resulted in constructing electronic hardware that does not operate correctly. Alternatively, knowingly using unreliable models leads designers to be extremely conservative in their designs, and not taking full advantage of the technology they are using and paying for.

Computerized software circuit simulators, such as International Business Machines Corporation's PowerSPICE, and Synopsys Corporation's, Star-Hspice™, allow "black box" models for transmission lines. PowerSPICE calls its "black box" an Rline; Star-Hspice™ calls its "black box" a W-element model. Hereinafter, such a "black box" model of a transmission line will simply be referred to as an Rline model, and such reference is intended to apply to any "black box" model of a transmission line that receives, as inputs, frequency dependent RLCG specifications. A user, or technology provider, provides the Rline model with tables, or expressions, for R, L, C, and G, versus frequency for each type of transmission line of interest in a particular simulation.

The Rline model uses user-supplied frequency tables or expressions that specify how the RLCG change as a function of frequency. This RLCG data is obtained, typically, from a field solver that examines the geometrical construction of the transmission line, applies engineering knowledge of how the geometries involved determine the RLCG elements, and output the RLCG values for use as input to the Rline model. The Rline model is then responsible for taking time-domain waveforms of signals on ends of the transmission line, using the frequency characteristics from the RLCG values, and yielding a time-domain response on ends of the transmission line. The time-domain circuit simulator may be providing the Rline model with discrete input voltage and current values at particular simulation time intervals; the time intervals may vary in length. As stated above, signals, especially the transitions of the signals, comprise an extremely wide range of frequencies. The task of creating accurate time-domain responses from time-domain signals using frequency dependent RLCG tables is extremely complex and difficult, involving curve fitting, convolution, and other numerical techniques, and modeling errors can easily occur.

Validation of an Rline model has been a difficult task, involving qualitative, empirical experience-based observations and insight based on complex attempts to correlate circuit simulation waveforms with hardware laboratory measurements. Although useful and insightful, these methods involved many unknown variables that limited the ability to make a definitive quantitative assessment of just the Rline model interacting with the circuit simulator. No prior art that uses circuit simulation techniques to validate and quantify the model input to simulator output accuracy in a closed-loop fashion is known to exist. Even if one is able to obtain a good time-domain graph of a high-speed input to a physical transmission line, together with the resulting output of the transmission line for comparison with the modeled input and output, it is difficult to determine reasons for error. Validation of an Rline model for all frequencies of interest has been a chronic problem.

Therefore, there is a need for a method that uses circuit simulation techniques to validate and quantify the model input to simulator output accuracy for an Rline model.

SUMMARY OF THE INVENTION

The present invention discloses a method of validating an Rline model used by a time-domain circuit simulator by comparing a set of frequency dependent resistance, inductance, capacitive, and conductance values (RLCG values) provided as input to the Rline model with a set of computed RLCG values output derived from the Rline model. The method provides a quantitative assessment of inaccuracies of the Rline model at frequencies of interest.

An embodiment of the method comprises simulation of two instances of the Rline model by a circuit simulator. The embodiment terminates an output of a first instance of the Rline model with an ideal terminator; providing a sinusoidal input signal of a first frequency to an input port on the first instance of the Rline model; and observing a response to the signal at the output port of the first instance of the Rline model. A second instance of the Rline model has a first port and a second port shorted together; the first and second ports further coupled to a sinusoidal input signal of the first frequency; current through the sinusoidal input signal is observed. Although different frequencies could be used as input to the two instances of the Rline, computation of the output RLCG values is greatly simplified by applying the same frequency to both instances of the Rline model. The method further computes output RLCG values that would produce the response, and compares the computed (output) RLCG values with the input RLCG values that were used as input to the Rline model for the first frequency, to determine, quantitatively, the accuracy of the Rline model, at the frequency selected.

An embodiment of the method further comprises iteration of the above embodiment for a number of frequencies, computing the output RLCG values that would produce the response at each frequency used, and comparing the computed output RLCG values with the corresponding input RLCG values of the input at each frequency, to determine the quantitative error of the Rline at each frequency.

In an embodiment, input RLCG values are plotted on a graph versus frequency. Computed output RLCG values are plotted on a graph; advantageously, the same graph, versus frequency. Such an embodiment allows ready comparison of computed output RLCG characteristics with input RLCG specifications, even if the frequencies used in simulation are not the same frequencies as those of the input RLCG input. Furthermore, simulations can be done at more or fewer frequencies than are specified in the input RLCG input. Of particular value is a graph of output RLCG values at a large number of frequencies, reducing the chances that the Rline model has an error that only occurs in a very small range of frequencies. Use of mathematical expressions, interpolations or equations, rather than graphical depiction, for comparison of the input RLCG and the computed RLCG values are within the spirit and scope of this invention.

BRIEF DESCRIPTION OF THE DRAWINGS

FIG. 2A shows a table of values of output RLCG versus frequency as computed from simulation results.

FIG. 2B shows a table of values of input RLCG versus frequency provided as input to the simulation model.

DETAILED DESCRIPTION OF THE PREFERRED EMBODIMENTS

Having reference now to the figures, the invention will now be described in detail.

Figure 1A:
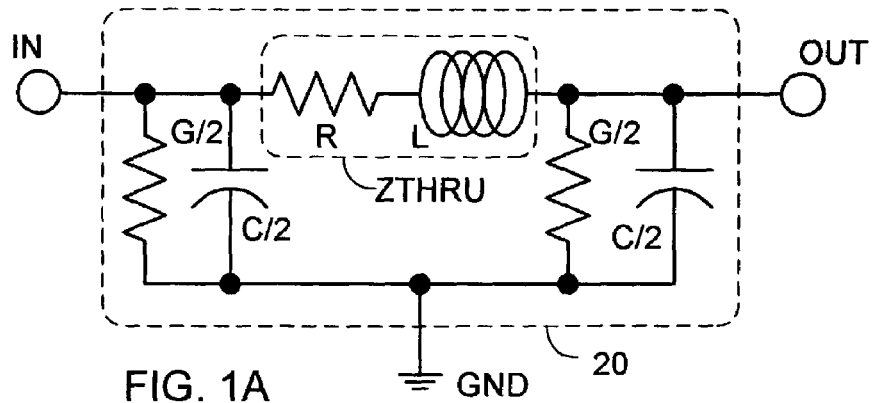
FIG. 1A shows a circuit equivalent of a segment of a transmission line.

Transmission lines are used to carry electrical signals, in particular, high-speed electrical signals. Transmission lines can be characterized by a circuit arrangement shown in FIG. 1A. Transmission line element 20 comprises R, L, C, and G. R represents series resistance per unit length. L represents inductance per unit length. C represents capacitance per unit length. G represents dielectric conductance per unit length. R, L, C, G each may be frequency dependent. Resistance, for example, rises significantly at frequencies above a gigahertz (GHz). Inductance drops with increasing frequency. Dielectric conductance rises with increasing frequency. Capacitance is typically not a strong function of frequency, but, in general, may also be considered to be frequency dependent. Typically, the elements that shunt portions of an electrical signal to ground, G and C, are divided in two with a capacitor equal to half the total capacitance per unit length placed at an input port and half placed at an output port. Similarly the dielectric conductance per unit length is typically modeled with a dielectric conductance equal to half the total dielectric conductance placed at the input port and another dielectric conductance equal to half the total dielectric conductance placed at the output port. The signal must travel through elements, R and L between the input port and the output port. R and L together are shown grouped as Zthru.

Modem circuit simulators typically make use of a "black box" model for transmission lines. Such models are called Rline models in this description. As discussed earlier, these "black box" models have various existing names and future models could be given other names. A particular simulator may have the "black box" included as a built-in function of the simulator. Alternatively, the "black box" model may be made available as a separate piece of software that can be used. All black-box models of transmission lines are within the spirit and scope of this invention, and are considered to be program products.

Users of the circuit simulator simply create an instance of the Rline for each transmission line they wish to simulate. Instantiations of the Rline typically reference a symbolic Rline model name, which associates characteristics of the transmission line (RLCG) values in tabular form or equation form with the instantiation. The user also typically must supply the length of the transmission line for the instantiation, as well as the circuit node names that the ports of the instantiation are coupled to. For example, consider the following two instantiations of a transmission line model:

ms_bus_5=Rline cardline (msb5a–msb5b–gnd) (length=20)
ms_bus_6=Rline cardline (msb6a–msb6b–gnd) (length=22)

ms_bus_5 above is a user-supplied name of an instantiation of an Rline model, perhaps for a main store bus bit 5. ms_bus_6 might be an instantiation of an Rline model for bit 6 of the main store bus.

Rline tells the simulator that this model is an instantiation of the Rline model.

cardline associates this instantiation of the Rline model with a set of characteristics of the particular transmission line that is being used in this instantiation. Perhaps this instantiation is for a card signal wire (Printed Wiring Board).

msb5a and msb5b are the node connections that the input and output signal ports of the instantiation for the main store bus bit 5 are coupled to in the simulation model. msb6a and msb6b are the node connections that the input and output signal ports of the instantiation for the main store bus bit 6 are coupled to in the simulation model. gnd is the ground voltage used in the simulation.

length is simply the length of this instantiation. For example, if length=20 and the per-unit length values are in centimeters, a 20 centimeter transmission line would be modeled. Similarly, length=22 would be the modeled length of the main store bus bit 6 transmission line.

The example above is for explanation only. Different simulators can and do have different syntax and naming conventions. Some Rline models have "ground" ports on both ends of the transmission lines, rather than the single ground port. Some Rline models have the capability to model multiple transmission lines in a single instantiation so that crosstalk effects can be simulated. All variations of the Rline model are considered to be within the spirit and scope of this invention.

Figure 1B:
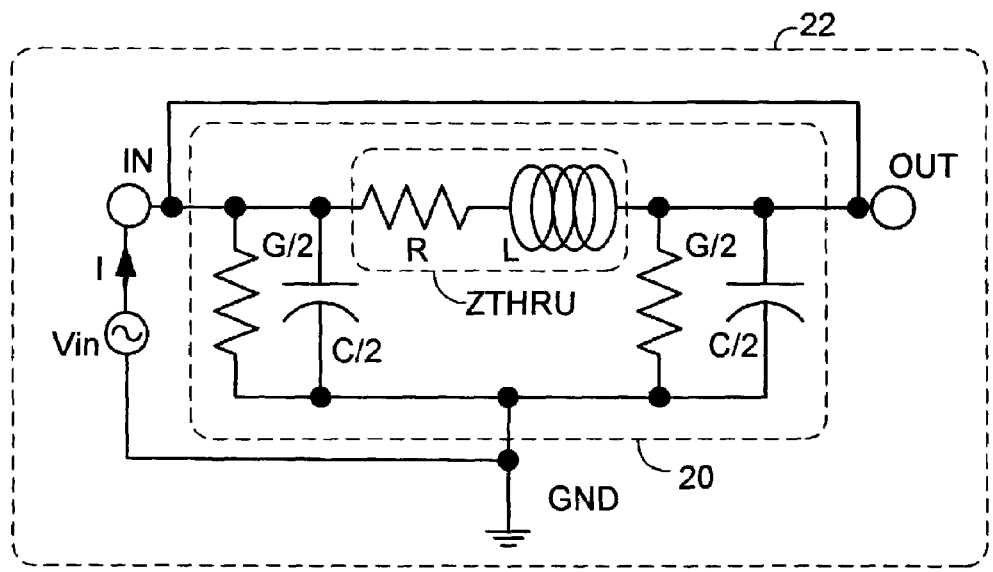
FIG. 1B shows the circuit equivalent of FIG. 1A with a sinusoidal voltage source coupled to the input; the input further coupled to the output.

FIG. 1B shows an instance of transmission line element 20 with the input port shorted to the output port. A sinusoidal voltage source is coupled to the input port. This instance, called parallel element determination model 22, is used to determine the Rline model's actual effective value of C and G, as will be described in more detail below.

Figure 1C:
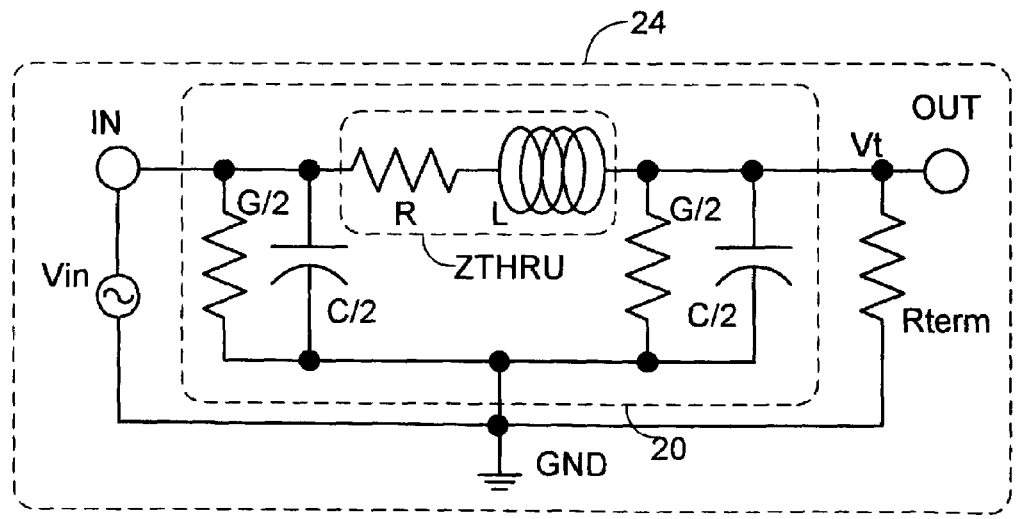
FIG. 1C shows the circuit equivalent of FIG. 1A with a sinusoidal voltage source coupled to the input; the output being terminated.

FIG. 1C shows an instance of transmission line element 20. An ideal resistive terminator is coupled between the output port and ground. A sinusoidal voltage source is coupled to the input port. This instance, called series element determination model 24, together with parallel element determination model 22, is used to determine the Rline's actual simulated value of R and L, as will be described in more detail below.

FIGS. 2A and 2B show values of RLCG in tabular form versus frequency. FIG. 2B shows an exemplary table of input RLCG suitable for use as input to the Rline model. Frequency in the exemplary FIG. 2B is in GHz and ranges from 1E-6 GHz to 10 GHz, a range suitable for most modern applications. The range and frequencies used can be extended to lower or higher frequencies, and more or fewer frequency points can be used. Any suitable way of providing input RLCG values versus frequency to an Rline model is contemplated in the present invention, including, but not limited to, tables as shown, equations, and data structures. Input RLCG values are normally obtained with field solver programs that examine the physical sizes, shapes, and spacings of conductors associated with a transmission line, and the dielectric materials separating the conductors. The field solver program uses this information, together with a programmed-in knowledge of field physics, to produce the input RLCG values versus frequency.

FIG. 2A is a table of output RLCG values computed from simulation runs. Derivation of these values will be described later. The values of FIG. 2A are compared to the corresponding values of FIG. 2B at various frequencies to demonstrate how accurately the Rline model simulates the transmission line at the various frequencies. The Rline model should simulate all frequency components of a signal accurately. Rline models receive a time-domain signal input from the time-domain simulator, and utilize the frequency-dependent input RLCG values and proprietary algorithms to produce a time-domain signal output. A predetermined specified agreement between the input RLCG and the output RLCG values is required to validate the accuracy of the Rline model. For example, a user may specify that the output RLCG values must match the input RLCG values within some predetermined percentage difference over a specified range of frequencies. Output RLCG values that exceed the predetermined percentage difference require modification of the internal algorithms of the Rline model.

FIGS. 3A–3D show plots of the input RLCG values and the output RLCG values versus frequency, using the exemplary data from the tables of FIGS. 2A and 2B. Presentation in graphical form allows a means to easily and visually detect anomalies between input RLCG values and output RLCG values. In the example, simulation cases at frequencies below about 4E-3 GHz were not run, as high frequency effects normally only occur at higher frequencies. Simulation cases at the lower frequencies could have been run. Simulation cases were run in the example at substantially the same frequency points as were used in the input RLCG data. However, this is not required, especially when presented in graphical form. Typically, input RLCG data makes a smooth curve on a graph and a limited number of frequency points are required. The Rline model, however, must accurately produce time-domain modeling for an extremely wide spectrum of frequencies. Errors in the Rline model algorithm may produce RLCG anomalies in only narrow bands of frequencies. Therefore, advantageously, the simulation is iterated over a large number of frequencies in an attempt to expose any Rline model defects that only appear in narrow frequency ranges. Alternative embodiments of comparing input RLCG values to output RLCG include, but are not limited to, printing out large percentage difference, absolute differences, or use of correlation techniques done either on a data processor or by manual analysis.

Figure 3A:
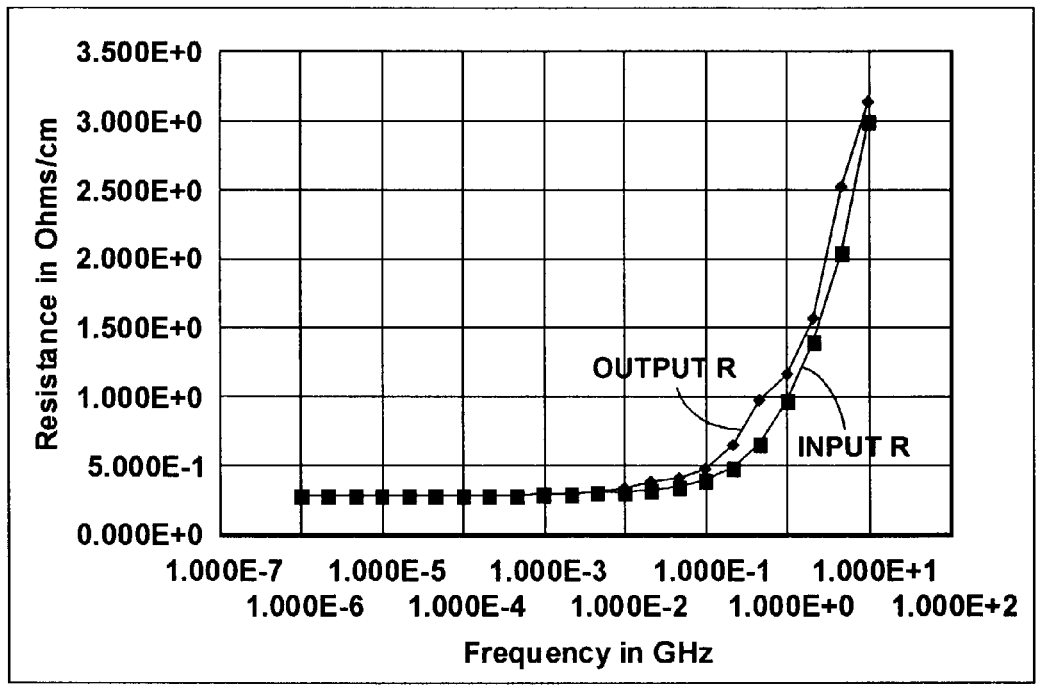
FIG. 3A shows a plot of resistance as specified, and resistance computed from simulation, plotted versus frequency.

FIG. 3A shows a plot of input R and output R versus frequency, with data points taken at substantially the same frequencies for simplicity. In this exemplary case, output R is shown to follow the same general curve shape as input R, but is slightly higher. In the example, at approximately 4E-1 GHz, output R is seen to be approximately one ohm/unit length, versus input R of approximately 0.6 ohm/unit length. This represents an error of about 67%. If this error exceeds the predetermined error tolerance, the Rline model developer must correct the algorithms used in the Rline model. It is possible that the time domain circuit simulator might require changes, if modifications to the Rline model cannot be made to bring the error within the predetermined error tolerance. Corrections to the model, to the model/circuit simulator interface, or the circuit simulator itself are intended, when corrections to the Rline model discussed herein.

Figure 3B:
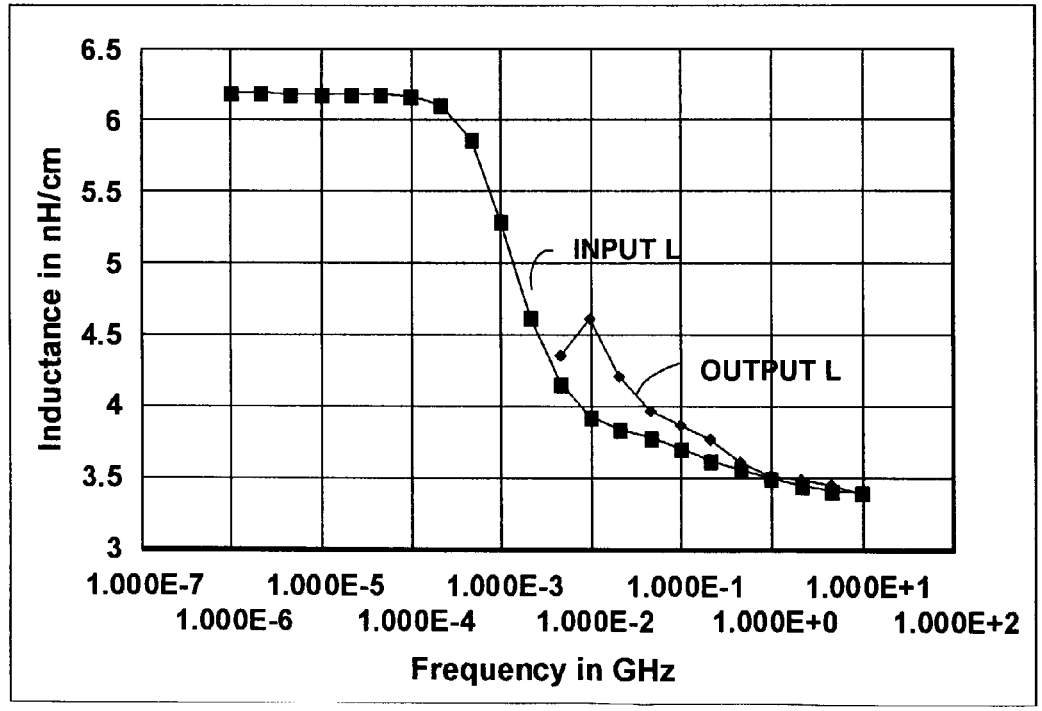
FIG. 3B shows a plot of inductance as specified, and inductance computed from simulation, plotted versus frequency.

FIG. 3B shows a plot of input L and output L versus frequency, with data points taken at substantially the same frequencies for simplicity. The output L is seen to exceed the input L by about 13% at 1E-2 GHz, but has much closer agreement for other frequencies. Again, if this anomaly exceeds predetermined error tolerance, the Rline model developer must correct the algorithms used in the Rline model.

Figure 3C:
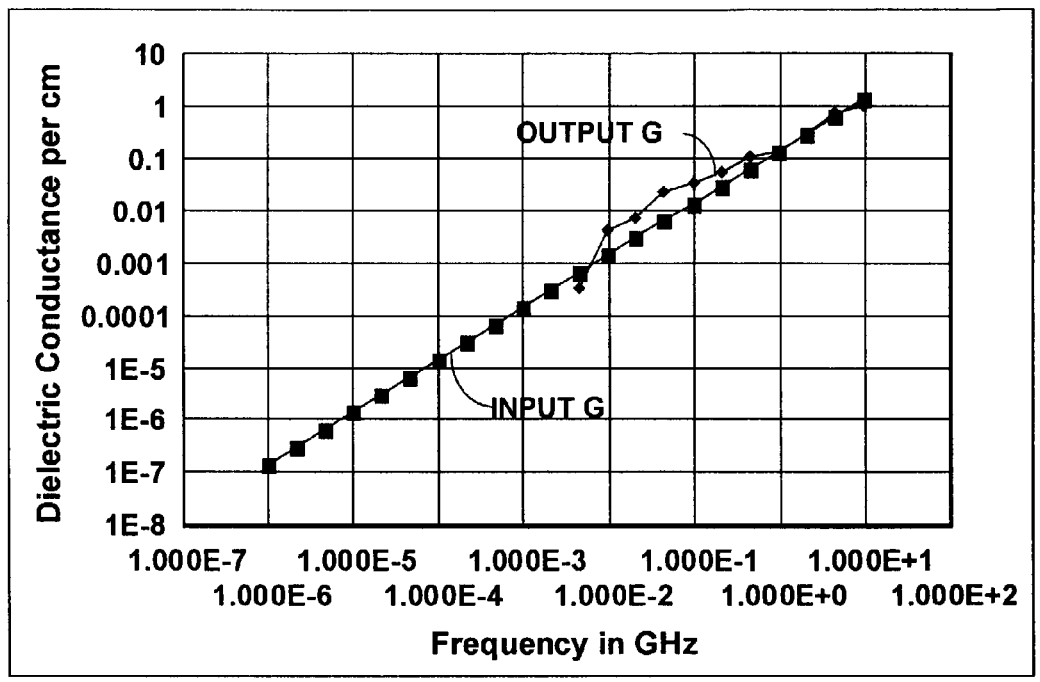
FIG. 3C shows a plot of dielectric conductance as specified, and dielectric conductance computed from simulation, plotted versus frequency.
Figure 3D:
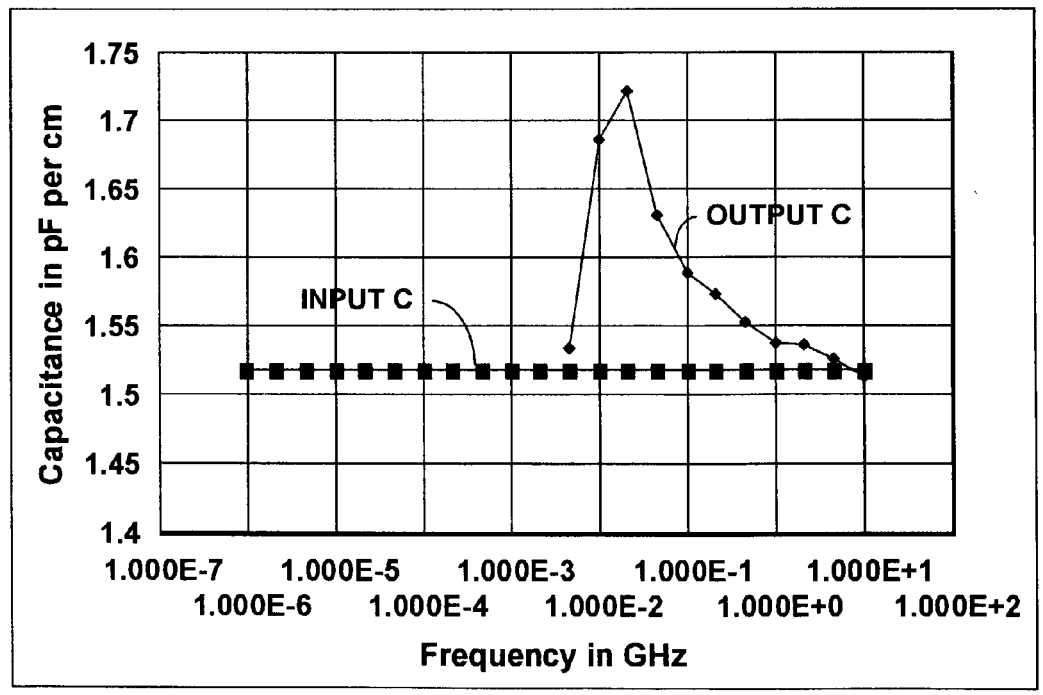
FIG. 3D shows a plot of capacitance as specified, and capacitance computed from simulation, plotted versus frequency.

Similarly, FIGS. 3C and 3D show plots of input G and C, and output C and G, versus frequency, with data points taken at substantially the same frequencies for simplicity. As with R and L, anomalies exceeding predetermined error tolerances must be addressed by the Rline developer.

Figure 4:
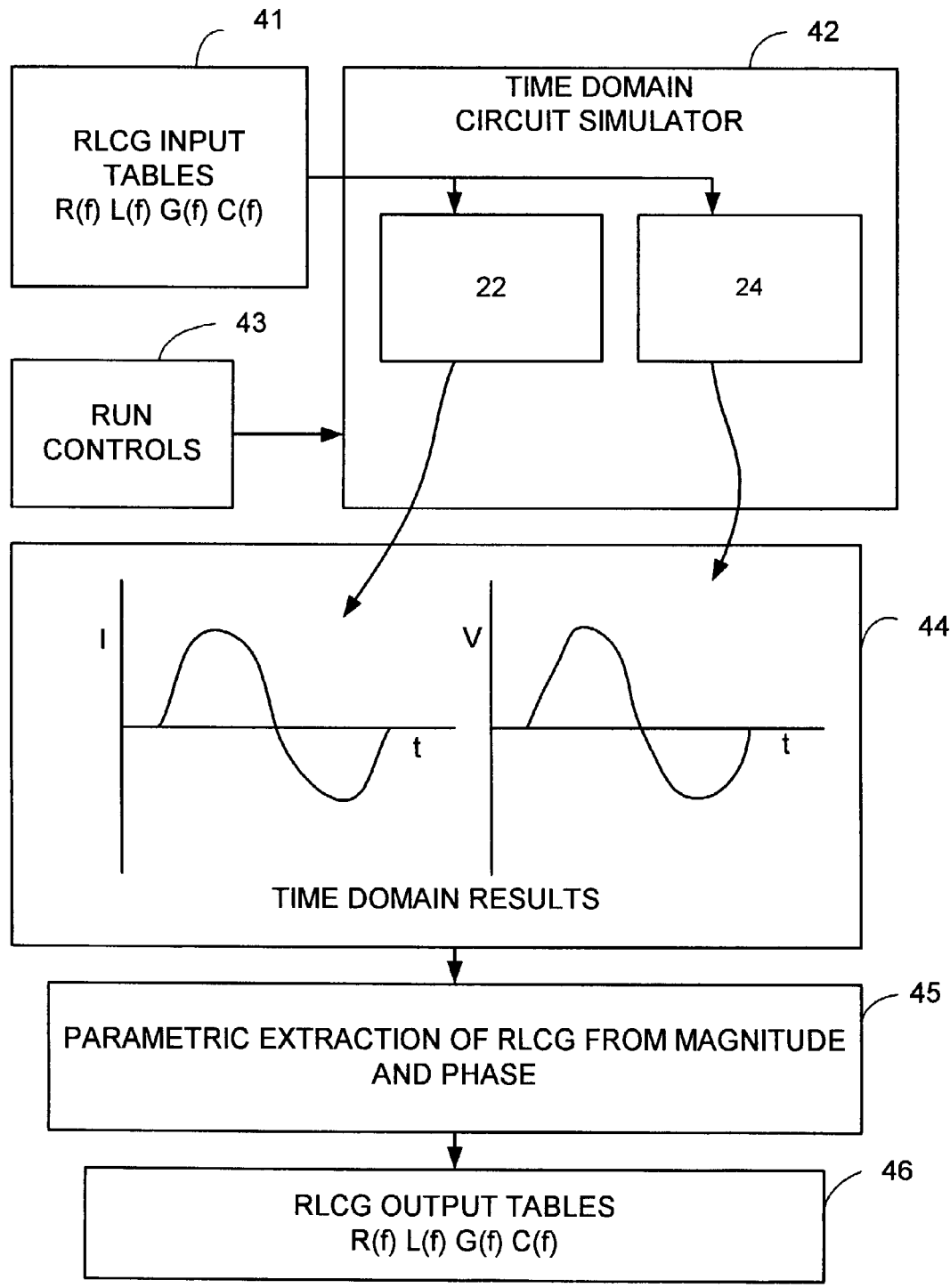
FIG. 4 shows a block diagram of the process of calculating R(f), L(f), G(f), and C(f).

FIG. 4 shows, in block diagram form, the process of creating the output RLCG values.

A field solver, as described above, creates input RLCG tables 41. RLCG tables 41 for simple transmission lines can alternatively be produced manually using field theory equations, or by taking data from similar transmission lines' tables or graphs. The tabular format is exemplary only, and the data could be instead in the form of equations, data structures, or other techniques.

Time-domain circuit simulator 42 is given a circuit model, including an instance of parallel element determination model 22 and an instance of series element determination model 24. In an alternative embodiment, separate simulations are performed, one simulation on model 22 by itself, and a second simulation on model 24 by itself, with data from both simulations to be later used to compute output RLCG. Advantageously, both model 22 and model 24 are simulated at the same time to reduce the number of simulations required.

Run controls 43 are user-supplied controls that specify certain items in the simulation, such as frequency, temperature, numerical convolution parameters, outputs desired, voltages, and frequency, for examples.

Outputs of the time-domain circuit simulator 42 simulation are stored as shown in block 44. In particular, the current I (current through the sinusoidal voltage source) output from model 22 is used to compute C and G. The Vt versus time from model 24, together with the I versus time from model 22 is used to compute Zthru, and from that, R and L. The computations are described below, and are performed in block 45, parametric extraction of output RLCG from magnitude and phase.

Model 22 has the input port of the Rline model and the output port of the Rline model shorted together. Since there is no voltage difference between the ends of Zthru, no current flows through Zthru. The voltage of the sinusoidal waveform is simply impressed across the two dielectric conductance elements, connected in parallel and the two capacitance elements conducted in parallel. Each dielectric conductance element is ½*G; each capacitive element is ½*C. Therefore the parallel combination of the two dielectric conductance elements is G; the parallel combination of the two capacitance elements is C. The magnitude of the sinusoidal voltage waveform is advantageously 1 volt to simplify the math, but any suitable voltage would work. The following equations assume a 1-volt sinusoidal input. "Re" denotes the "real" component of a vector; "Im" denotes the "imaginary" component of a vector. From Ohm's Law: (The "(f)" denotes "for the frequency used"; f is the frequency used)

$$G(f)=Re[I] \quad (1)$$

$$C(f)=Im[I]/(2*pi*f) \quad (2)$$

Model 24 is shown with an ideal termination resistance, Rterm, coupled between the output port of the Rline model and ground. The ideal termination resistance is highly desirable, but model 24 would still be usable without Rterm. Rterm ensures a current of a magnitude that is typically expected to flow through Zthru. For example, many transmission lines used in data processing systems have an impedance of approximately 50 ohms. Use of an Rterm of 50 ohms would be advantageous when characterizing such a transmission line. A 1-volt sinusoidal input is applied to the input port of the Rline model. From Ohm's Law again, (with ω=2*pi*f)

$$Zthru(f)=(Vin-Vt)/(Vt/Rterm+Vt*(G/2+j\omega*C/2)) \quad (3)$$

$$R(f)=Re[Zthru] \quad (4)$$

$$L(f)=Im[Zthru]/(2*pi*f) \quad (5)$$

The block 45 calculation of the parametric values from the simulation data can be done directly within the circuit simulator if it has the features to support the complex-domain mathematics if the simulation is an "ac" run (ie, ".AC" in a Star-Hspice run). For example, in Synopsys Corporation's Star-Hspice™, in an AC simulation, imaginary current through a component R1, and real voltage between nodes 7 and ground can be printed using the ".PRINT" statement: (example taken from Synopsys Corporation's Star-Hspice Manual, Release 1999.4, page 7–5)

. PRINT AC II(R1) VR(7)

Phase angles and magnitudes of voltages and currents are also available for printout in an "ac" run in available circuit simulators, such as Star-Hspice™.

However, in general, circuit simulators handle circuit elements differently in an "ac" run versus a time-domain, or transient run (i.e., ".tran" in a Star-Hspice run). It is the primary intent of this invention to quantitatively evaluate accuracy of the Rline model, as simulated by the time-domain simulator, in the time-domain.

Figure 6:
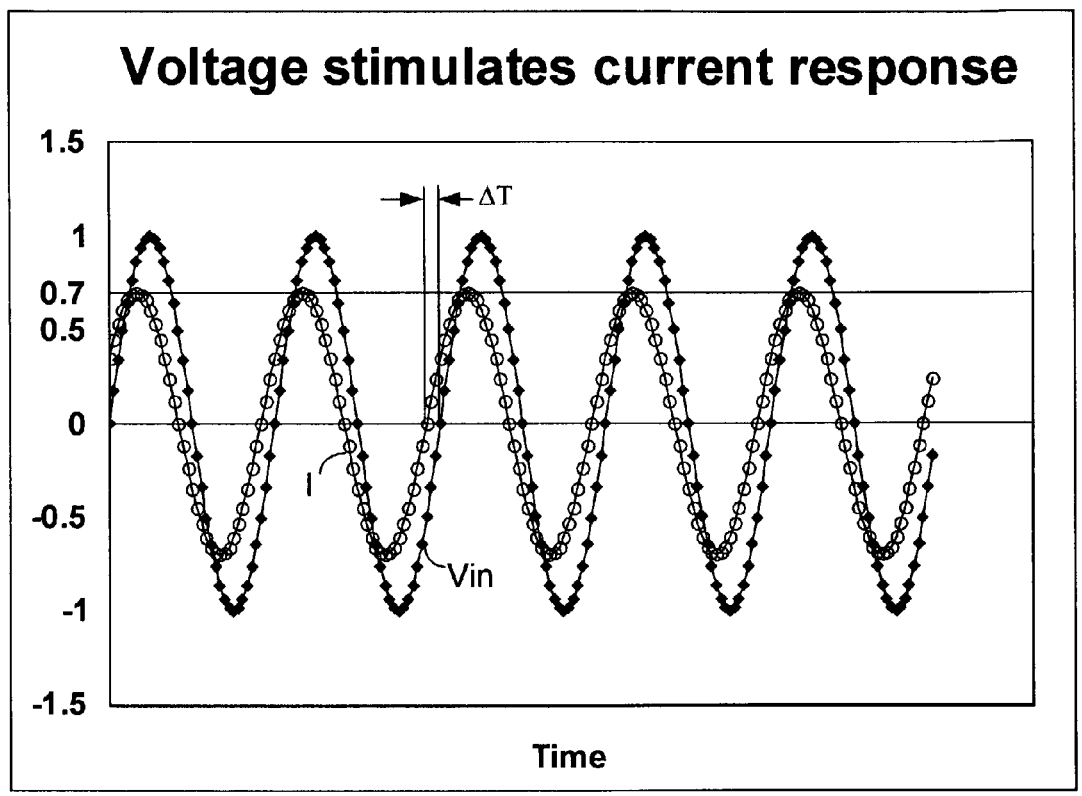
FIG. 6 shows several cycles of a current and voltage versus time.

Several procedures can be followed to get the real and imaginary values used in equations 1–5 above, but in a time-domain, transient simulation, where available circuit simulators do not support automatic computation of real and imaginary components of a vector. FIG. 6, for example, shows a plot of voltage Vin (a 1-volt sinusoidal voltage waveform) and I (current through the sinusoidal voltage source) as used in model 22. The magnitude of the current I is seen graphically in the example of FIG. 6 to be 0.7 amps. A phase angle, Θ, between current I and Vin, in degrees, can be computed by:

$$\Theta=\Delta T/T*360 \quad (6)$$

where T is the period of the sinusoidal Vin (i.e., 1/frequency), and ΔT is the difference in time between the zero crossings. ΔT could be measured at other points, such as at the peak magnitudes of I and Vin, but measurement at zero crossings is usually more convenient. With magnitude and phase angle known in the exemplary model 22 simulation, at frequency f, $$G(f) = Re[I] = \text{magnitude}(I) * \cos(\Theta) \quad (7)$$

$$C(f) = Im[I]/(2*pi*f) = \text{magnitude}(I) * \sin(\Theta)/(2*pi*f) \quad (8)$$

ΔT and the magnitude of current I can be manually read from graphical plots, or can be computed by equations programmed by the user into the simulation to determine these values. For example, "peak detection" equations can be used to find the magnitude of the current. Alternatively, a root mean square (RMS) value over one or more cycles of simulation can be computed for the current waveform; the magnitude then computed by dividing by 0.707 (i.e., sqrt (2)/2), as is well-known for sinusoidal waveforms.

Advantageously, a number of cycles of the Vin sinusoidal voltage are simulated at a given frequency. Averaging the magnitudes and the phase angles for more than one cycle increases the accuracy of the computed C and G values. Use of the very first cycle may introduce errors involved in startup transients. Any means of determining ΔT and the magnitude of current I are considered within the spirit ad scope of the present invention.

Similarly, the magnitude of (Vin-Vt) in a simulation of model 24 and the phase angle between Vt and Vin can be graphically determined or can be computed by equations programmed by the user into the simulation.

G and C were determined above for the frequency simulated; Rterm is a user-defined fixed value. Alternatively, G and C as provided in the input RLCG data could be used in the following calculation of Zthru. Therefore, all information needed in equation (3) is available, and Zthru can be computed as a vector impedance having a magnitude and a phase angle Θ. R and L at the simulated frequency f are then computed per equations (9) and (10):

$$R(f) = Re[Zthru] = \text{magnitude}(Zthru) * \cos(\Theta) \quad (9)$$

$$L(f) = Im[Zthru]/(2*pi*f) = \text{magnitude}(Zthru) * \sin(\Theta)/(2*pi*f) \quad (10)$$

The output RCLG values extracted from the simulation at the one or more frequencies selected are placed into output RLCG tables in block 46. As before, tabular format is only one way to place the values for easy comparison with the input RLCG values. Equations, data structures or any means suitable for storing data are within the spirit and scope of the present invention.

Figure 5:
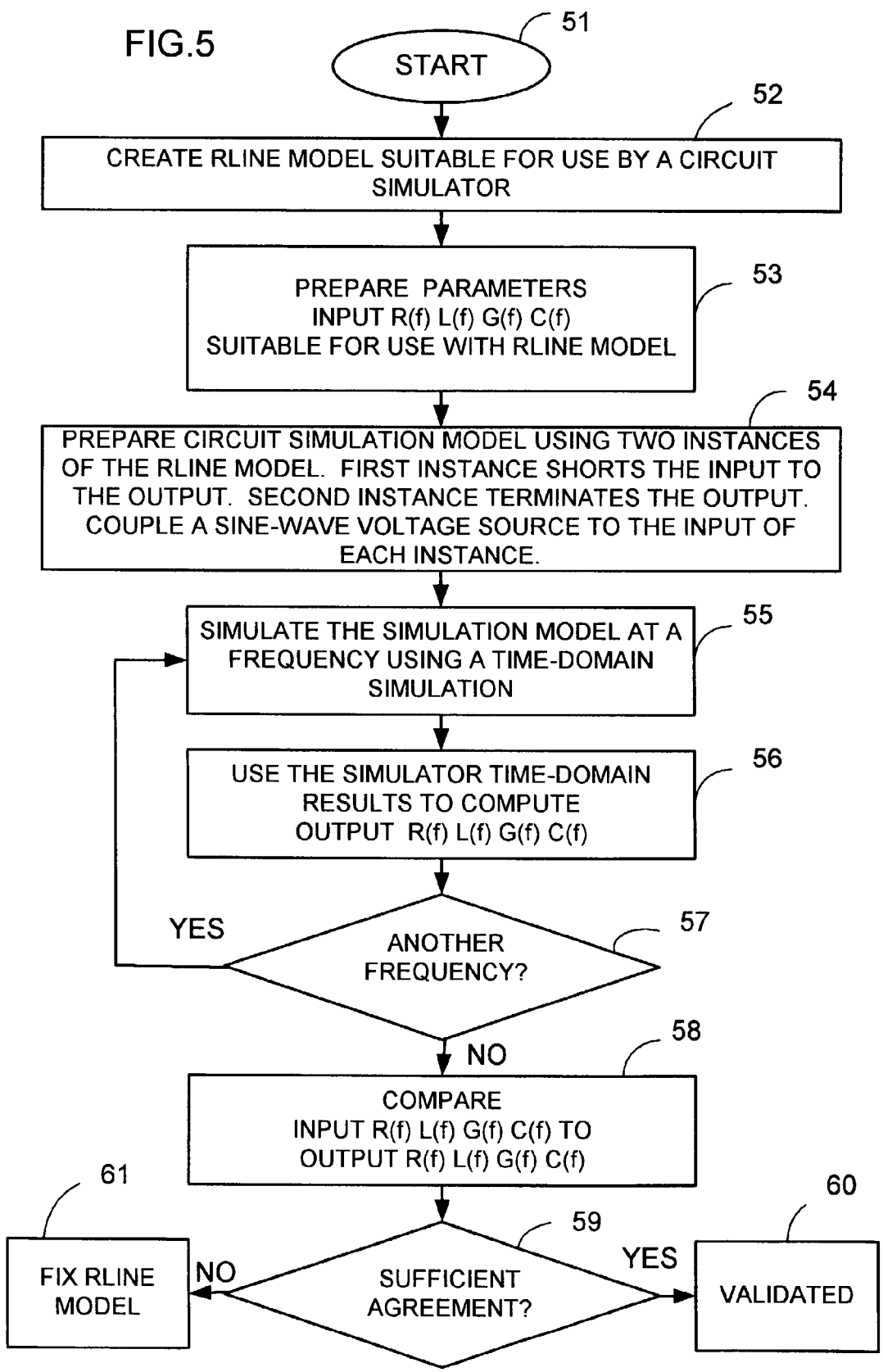
FIG. 5 shows a flow chart of an embodiment of the method of quantitatively validating an Rline model.

FIG. 5 is a flow chart of an embodiment of the present invention.

Step 51 is simply the beginning of the process, and control passes to step 52.

In step 52, an Rline model is created, suitable for use by a circuit simulator. This Rline model must be capable of using frequency-domain input RLCG data to accurately model a transmission line over a wide range of frequency. Algorithms used in Rline models are usually proprietary, and are not generally known to the user of the circuit simulator. In International Business Machines's PowerSPICE, for example, the input RLCG values (frequency dependent) are translated into complex propagation and admittance functions, numerically fitted, and convolved, to yield the time-domain response voltage and current outputs from time-domain voltage and current inputs to the Rline model. The necessary numerical fitting and convolution is a known problematic area that can introduce errors. Quantification of these errors is provided by the method taught in the present invention.

In step 53, the user, or, more likely, a technology support person, prepares the frequency-dependent RLCG parameters, or values in a form suitable to be used as input to the Rline model. Most commonly, a tabular format is used, but equations, data structures, or any other means of inputting these values to the Rline model is within the spirit and scope of the present invention. Preparation of these values typically involves use of a field solver and/or related programs, graphs, or tables, as described earlier.

In step 54, the user prepares a circuit simulation model suitable for analysis by the circuit simulator of choice. A first portion of the circuit simulation model is an instantiation of model 22, as described earlier. This portion creates an instantiation of the Rline, with the input and output ports of the Rline shorted together. A sinusoidal voltage input (advantageously of 1-volt magnitude) is coupled from ground to the input port. A second portion of the circuit simulation model is an instantiation of model 24. In model 24, an ideal termination is coupled between the output port of the Rline and ground. A sinusoidal voltage input (advantageously of 1-volt magnitude) is coupled from ground to the input port. As described earlier, separate simulations can be run on model 22 and model 24, but the number of simulations can be reduced if model 22 and model 24 are simulated at the same time.

In step 55, the circuit simulation model is simulated by the time-domain circuit simulator at a predetermined frequency of the sinusoidal voltages in the instantiations of model 22 and model 24, using a time-domain simulation. Preferably, more than one cycle of the sinusoidal input voltages are simulated, although a single cycle is also contemplated and is considered within the scope of the invention. Advantageously, both voltages are at the same frequency to greatly simplify computation of output RLCG values. Use of different frequencies of the sinusoidal voltage inputs is possible, but complicates computation of output RLCG values.

In step 56, the time-domain simulation results (files, printouts, or other means of producing output by the simulator) are used to compute RLCG at the chosen frequency, as described in equations 1–5.

In step 57, a check is made to see if the circuit simulation model should be re-run, using another frequency for the sinusoidal voltage inputs. If so, control is passed to step 55; if not, control passes to step 58.

In step 58, input RLCG values are compared to output RLCG values. As described earlier, in an embodiment of the comparison step production of graphs is performed for visual comparison. In another embodiment mathematical correlation of the input RLCG values with the output RLCG values is performed. In another embodiment, secondary transmission line characteristics, such as frequency-dependent attenuation values, or propagation delay values, which may be computed from the RLCG values, may be independently computed from the input RLCG and output RLCG data and may also be compared in step 58. For example, where α is frequency-dependent attenuation per unit length, α at a particular frequency, f, is computed as per equation 11:

$$\alpha(f) = Re|\text{sqrt}((R(f)+j\omega L(f)) * (G(f)+j\omega C(f)))| \text{ where } |x| \text{ indicates the absolute value of } x. \quad (11)$$

Any other means of comparing of the input RLCG values to the output RLCG values, as well as comparing computed secondary transmission line characteristics, is considered within the spirit and scope of the present invention.

In step 59, a check is made to see if the output RLCG values are within a predetermined range of agreement with the input RLCG values. If so, the Rline model is sufficiently accurate and can be used with confidence in further simulations of transmission lines by users of the Rline model. If not, the Rline model must be fixed so that it achieves the accuracy required. The output RLCG values and the comparison of those to the input RLCG values are valuable to the Rline developer in correcting the internal algorithms of the Rline model.

An Rline model is a program product that exists on a computer-readable medium. A program product is a set of instructions that, when executed on a suitable computer, causes the computer to perform the function defined by the set of instructions. Computer-readable media include, but are not limited to, magnetic disks, magnetic tapes, floppy disks, CD-ROMs, flash memory products, and data transmission media, including the Internet. Advantageously, an Rline model program product that is sold or licensed is validated as taught in the method taught above.

While the present invention has been described with reference to the details of the embodiments of the invention shown in the drawings, these details are not intended to limit the scope of the invention as claimed in the appended claims.

What is claimed is:

1. A method to quantitatively validate a transmission line model for time-domain simulation, comprising the steps of:
    simulating the transmission line model at a predetermined frequency;
    providing a frequency dependent input transmission line characteristic usable by the transmission line model;
    computing an output transmission line characteristic at the predetermined frequency using the results of the simulation; and
    comparing the output transmission line characteristic with the input transmission line characteristic, the step of comparing further comprising the steps of:
    computing a difference between the output transmission line characteristic and the input transmission line characteristic;
    comparing the difference with a predetermined allowable difference; and
    documenting an excessive difference that exceeds the allowable difference.

2. The method of claim 1, wherein the step of providing the frequency dependent input transmission line characteristic further comprises providing resistance per unit length as the characteristic.

3. The method of claim 1, wherein the step of providing the frequency dependent input transmission line characteristic further comprises providing inductance per unit length as the characteristic.

4. The method of claim 1, wherein the step of providing the frequency dependent input transmission line characteristic further comprises providing dielectric conductance per unit length as the characteristic.

5. The method of claim 1, wherein the step of providing the frequency dependent input transmission line characteristic further comprises providing capacitance per unit length as the characteristic.

6. The method of claim 1, wherein the step of comparing the output transmission line characteristic with the input transmission line characteristic further comprises comparing a secondary output transmission line characteristic computed from the output transmission line characteristic with a secondary input transmission line characteristic computed from the input transmission line characteristic.

7. The method of claim 1, further comprising the step of:
    iterating the simulation for a predetermined set of frequencies.

8. The method of claim 7, further comprising the steps of:
    plotting the input transmission line characteristic versus frequency; and
    plotting the output transmission line characteristic versus frequency for frequencies in the predetermined set of frequencies.

9. The method of claim 1, in which the step of simulating the transmission line model in the time-domain further comprises the steps of:
    simulating a first instance of the transmission line model in which an input port of the first instance is coupled to an output port of the first instance, and in which a sinusoidal voltage source is coupled to the input port of the first instance; and
    simulating a second instance of the transmission line model in which a sinusoidal voltage source is coupled to an input port of the second instance.

10. The method of claim 9, in which the step of simulating the second instance further comprises coupling a termination resistance to an output port of the second instance of the transmission line.

11. The method of claim 9, in which the step of using results of the simulation to compute an output transmission line characteristic at the predetermined frequency further comprises the step of computing a value of capacitance per unit length using a magnitude of a current through the sinusoidal voltage source of the first instance of the transmission line model, and a phase angle between the current and the sinusoidal voltage.

12. The method of claim 9, in which the step of using results of the simulation to compute an output transmission line characteristic at the predetermined frequency further comprises the step of computing a value of dielectric conductance per unit length using a magnitude of a current through the sinusoidal voltage source of the first instance of the transmission line model, and a phase angle between the current and the sinusoidal voltage.

13. The method of claim 9, in which the step of using results of the simulation to compute an output transmission line characteristic at the predetermined frequency further comprises the step of computing a value of resistance per unit length using a magnitude of a difference between a voltage on the output port of the second instance of the transmission line model and the sinusoidal voltage coupled to the input port of the second instance of the transmission line model, and the phase angle between the voltage on the output port of the second instance and the sinusoidal voltage coupled to the input port of the second instance.

14. The method of claim 9, in which the step of using results of the simulation to compute an output transmission line characteristic at the predetermined frequency further comprises the step of computing a value of inductance per unit length using a magnitude of a difference between a voltage on the output port of the second instance of the transmission line model and the sinusoidal voltage coupled to the input port of the second instance of the transmission line model, and the phase angle between the voltage on the output port of the second instance and the sinusoidal voltage coupled to the input port of the second instance.

15. A program product comprising a transmission line model validated by the method of claim 1;
   wherein the program product exists on a computer-readable medium.

16. A program product comprising a transmission line model, the model being validated by the following steps:
   simulating the transmission line model in the time-domain, at a predetermined frequency, using a circuit simulator;
   providing a frequency dependent input transmission line characteristic usable by the transmission line model;
   using results of the simulation to compute an output transmission line characteristic at the predetermined frequency; and
   comparing the output transmission line characteristic with the input transmission line characteristic, the step of comparing further comprising the steps of:
   computing a difference between the output transmission line characteristic and the input transmission line characteristic;
   comparing the difference with a predetermined allowable difference; and
   documenting an excessive difference that exceeds the allowable difference;
   wherein the program product exists on a computer-readable medium.

* * * * *